(12) United States Patent
Philips et al.

(10) Patent No.: US 8,405,815 B2
(45) Date of Patent: Mar. 26, 2013

(54) FLUID HANDLING STRUCTURE, LITHOGRAPHIC APPARATUS AND DEVICE MANUFACTURING METHOD

(75) Inventors: Danny Maria Hubertus Philips, Son en Breugel (NL); Daniel Jozef Maria Direcks, Simpelveld (NL); Maikel Adrianus Cornelis Schepers, Nuenen (NL); Paul Petrus Joannes Berkvens, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 305 days.

(21) Appl. No.: 12/795,091

(22) Filed: Jun. 7, 2010

(65) Prior Publication Data

US 2011/0013158 A1 Jan. 20, 2011

Related U.S. Application Data

(60) Provisional application No. 61/185,361, filed on Jun. 9, 2009.

(51) Int. Cl.
*G03B 27/52* (2006.01)
(52) U.S. Cl. .......................... 355/30; 355/67
(58) Field of Classification Search ............ 355/30, 355/50, 53, 67
See application file for complete search history.

(56) References Cited

U.S. PATENT DOCUMENTS

| | | | |
|---|---|---|---|
| 4,509,852 A | 4/1985 | Tabarelli et al. | |
| 7,081,943 B2 | 7/2006 | Lof et al. | |
| 7,679,718 B2 * | 3/2010 | Nakano | 355/53 |
| 8,054,448 B2 * | 11/2011 | Poon et al. | 355/53 |
| 2004/0113925 A1 | 6/2004 | Kim et al. | |
| 2004/0136494 A1 | 7/2004 | Lof et al. | |
| 2004/0207824 A1 | 10/2004 | Lof et al. | |
| 2005/0018155 A1 | 1/2005 | Cox et al. | |
| 2006/0023183 A1 * | 2/2006 | Novak et al. | 355/53 |
| 2006/0028632 A1 * | 2/2006 | Hazelton et al. | 355/53 |
| 2006/0119809 A1 | 6/2006 | Verhagen et al. | |
| 2006/0232756 A1 * | 10/2006 | Lof et al. | 355/53 |
| 2007/0110213 A1 * | 5/2007 | Leenders et al. | 378/34 |
| 2007/0243329 A1 | 10/2007 | De Graaf | |
| 2007/0291241 A1 * | 12/2007 | Sakai et al. | 355/53 |
| 2008/0002169 A1 * | 1/2008 | Hasegawa et al. | 355/53 |
| 2008/0212046 A1 | 9/2008 | Riepen et al. | |
| 2009/0073395 A1 | 3/2009 | Berkvens et al. | |

(Continued)

FOREIGN PATENT DOCUMENTS

EP  1 420 300 A2  5/2004
JP  2004-289126   10/2004

(Continued)

OTHER PUBLICATIONS

Japanese Office Action mailed Feb. 1, 2012 in corresponding Japanese Patent Application No. 2010-126422.

(Continued)

*Primary Examiner* — Thomas R Artman
(74) *Attorney, Agent, or Firm* — Pillsbury Winthrop Shaw Pittman LLP

(57) ABSTRACT

A fluid handling structure configured to supply and confine immersion liquid to a space defined between a projection system and a facing surface facing the fluid handling structure is disclosed. A first portion of an undersurface of the fluid handling structure, in use, is a different distance from the facing surface than a second portion of the undersurface. Further, the first portion has defined in it a supply opening configured to supply liquid toward the facing surface, and an extraction opening configured to remove fluid from between the fluid handling structure and the facing surface.

20 Claims, 7 Drawing Sheets

U.S. PATENT DOCUMENTS

2009/0279060 A1 11/2009 Direcks et al.
2011/0013158 A1* 1/2011 Philips et al. .................. 355/30

FOREIGN PATENT DOCUMENTS

| JP | 2004-320016 | 11/2004 |
| --- | --- | --- |
| JP | 2005-045223 | 2/2005 |
| JP | 2005-303167 | 10/2005 |
| JP | 2005-353820 | 12/2005 |
| JP | 2006-019720 | 1/2006 |
| JP | 2006-049476 | 2/2006 |
| JP | 2007-005363 | 1/2007 |
| JP | 2007-019463 | 1/2007 |
| JP | 2007-504662 | 3/2007 |
| JP | 2007-142366 | 6/2007 |
| JP | 2007-528115 | 10/2007 |
| JP | 2007-288185 | 11/2007 |
| JP | 2007-335662 | 12/2007 |
| JP | 2008-034801 | 2/2008 |
| JP | 2008-124283 | 5/2008 |
| JP | 2008-147652 | 6/2008 |
| JP | 2009-111349 | 5/2009 |
| WO | 99/49504 A1 | 9/1999 |
| WO | 2005/064405 A2 | 7/2005 |

OTHER PUBLICATIONS

Riepen et al. U.S. Appl. No. 61/181,158, filed May 25, 2009.

* cited by examiner

FLUID HANDLING STRUCTURE, LITHOGRAPHIC APPARATUS AND DEVICE MANUFACTURING METHOD This application claims priority and benefit under 35 U.S.C. §119(e) to U.S. Provisional Patent Application No. 61/185,361, entitled "Fluid Handling Structure, Lithographic Apparatus and a Device Manufacturing Method", filed on Jun. 9, 2009. The content of that application is incorporated herein in its entirety by reference.

FIELD

The present invention relates to a fluid handling structure, a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning dev ice to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarhon, and/or an aqueous solution.

Submersing the substrate or substrate and substrate table in a bath of liquid (see, for example, U.S. Pat. No. 4,509,852) is a form of immersion system arrangement. The arrangement requires that a large body of liquid should be accelerated during a scanning exposure. This may require additional or more powerful motors and turbulence in the liquid may lead to undesirable and unpredictable effects.

Another arrangement proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. This type of arrangement may be referred to as a localized immersion system arrangement.

PCT patent application publication WO 2005/064405 discloses another type of immersion system arrangement referred to the all wet arrangement in which the immersion liquid is unconfined. In such a system the whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid a, still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

After exposure of a substrate in an immersion lithographic apparatus, the substrate table is moved away from its exposure position to a position in which the substrate may be removed and replaced by a different substrate. This is known as substrate swap. In a two stage lithographic apparatus, the substrate tables swap may take place under the projection system.

In an immersion apparatus, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member; such a barrier member may be a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. The fluid handling system may be located between the projection system and the substrate table. In reference to the aforementioned description, reference in this paragraph to a feature defined with respect to fluid may be understood to include a feature defined with respect to liquid.

In a fluid handling system using liquid. such as a liquid confinement structure, liquid is confined to a space i.e. in an immersion space. For example, within a confinement structure, the liquid is confined by the body of the structure, the surface of the projection system and the underlying surface (e.g. a substrate table, a substrate supported on the substrate table, a shutter member and/or a measurement table). in the case of a localized area immersion system, the liquid is also confined in the immersion space by a liquid meniscus between the fluid handling system and the underlying structure. In the case of an all wet system, liquid is allowed to flow out of the immersion space onto the top surface of the substrate and/or substrate table.

SUMMARY

A fluid handling structure with a supply opening configured to supply liquid to an underlying surface, such as a substrate and/or substrate table, and an extraction opening configured to remove fluid from between the fluid handling structure and the underlying surface, the extraction opening defined in an undersurface of the fluid handling structure, can be stiff in the direction of the optical axis. This is undesirable because it may lead to focusing errors.

It is therefore desirable, for example, to provide a fluid handling structure which has reduced stiffness.

In an aspect, there is provided fluid handling structure configured to supply and confine immersion liquid to a space defined between a projection system and a facing surface facing the fluid handling structure, wherein a first portion of an undersurface of the fluid handling structure, in use, is a different distance from the facing surface than a second portion of the undersurface, and the first portion has formed in it: a supply opening configured to supply liquid toward the facing surface; and an extraction opening configured to remove fluid from between the fluid handling structure and the facing surface.

In an aspect, there is provided a fluid handling structure configured to supply and confine immersion liquid to a space defined between a projection system and a facing surface facing the fluid handling structure, wherein an undersurface of the fluid handling structure has formed therein a supply opening configured to supply liquid toward the facing surface and an extraction opening configured to remove fluid from between the fluid handling structure and the facing surface, wherein the undersurface is at most 10 mm in length in the radial direction with respect to the optical axis of the projection system.

In an aspect, there is provided a fluid handling structure configured to supply and confine immersion liquid to a space defined between a projection system and a facing surface facing the fluid handling structure, wherein in a portion of an undersurface of the fluid handling structure is formed: a supply opening configured to supply liquid toward the facing surface; and an extraction opening configured to remove fluid from between the fluid handling structure and the facing surface, wherein the portion of the undersurface is protruding with respect to another portion of the undersurface.

In an aspect, there is provided a device manufacturing method comprising providing a fluid between a final element of a projection system and a substrate by, wherein the providing includes supplying liquid towards the substrate through a supply opening in an undersurface of a fluid handling structure and removing fluid from between the fluid handling structure and the substrate and/or a substrate table through an extraction opening in the undersurface of the fluid handling structure, wherein the openings are formed in a first portion of the undersurface of the fluid handling structure which is a different distance from the substrate and/or substrate table than a second portion of the undersurface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
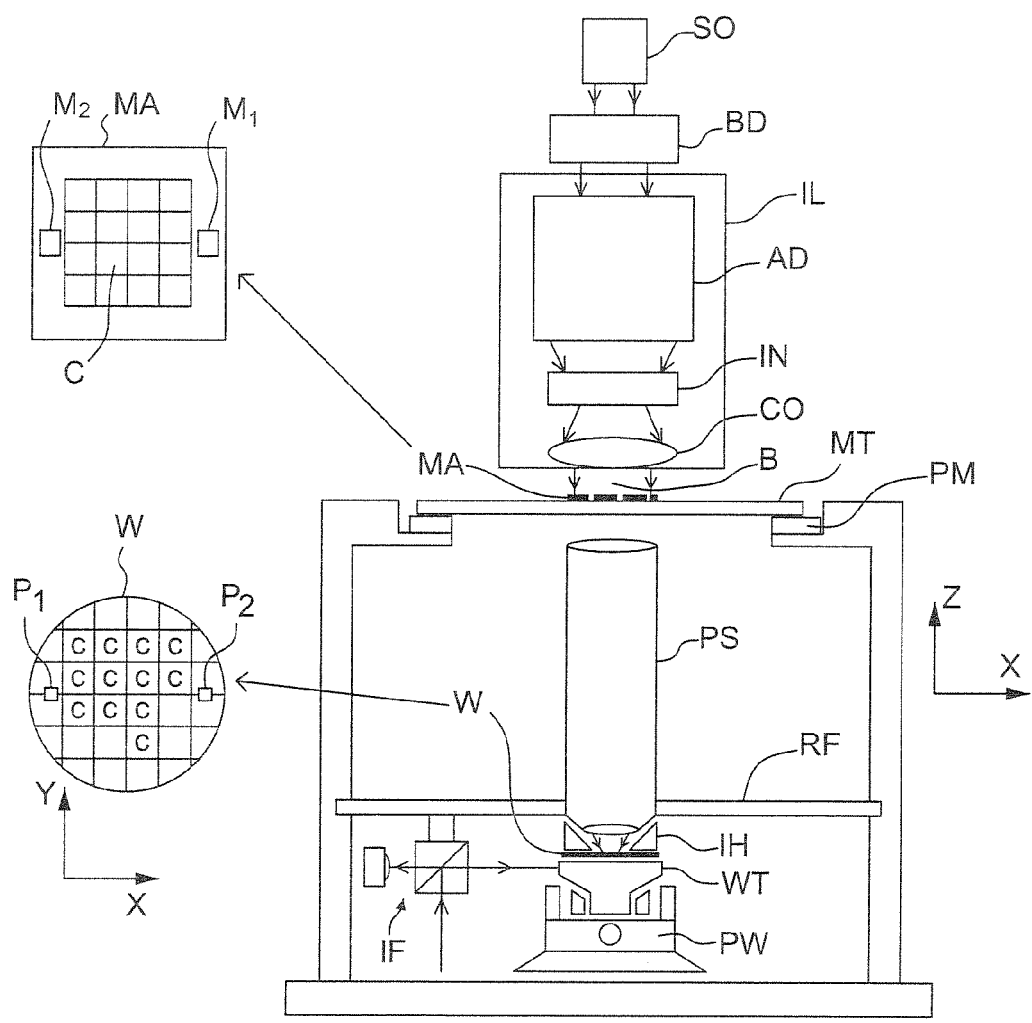
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or DUN/ radiation);
- a support structure (e.g. a mask table) MT constructed to support a patterning device (e.g. a mask) MA and connected to a first positioner PM configured to accurately position the patterning device MA in accordance with certain parameters;
- a substrate table (e.g. a wafer table) WT constructed to hold a substrate (e.g. a resist-coated wafer) W and connected to a second positioner PW configured to accurately position the substrate W in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. The support structure MT holds the patterning device MA in a manner that depends on the orientation of the patterning device MA, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as desired. The support structure MT may ensure that the patterning device MA is at a desired position, for example with respect to the projection system PS. Any use of the terms "reticle" or "mask" herein may be considered synonymous with the more general term "patterning dev "

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted minors impart a pattern in a radiation beam which is reflected by the mirror matrix.

The term "projection system" used herein should be broadly interpreted as encompassing any type of projection system. The types of projection system may include: refractive, reflective, catadioptric, magnetic, electromagnetic and electrostatic optical systems, or any combination thereof. The selection or combination of the projection system is as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS. The projection system PS focuses the beam B onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

In another mode, the support structure MT is kept essentially stationary holding a programmable patterning device, and the substrate table WI is moved or scanned while a pattern imparted to the radiation beam B is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed.

An arrangement to provide liquid between a final element of the projection system PS and the substrate is the so called localized immersion system IH. In this system a fluid handling structure is used in which liquid is only provided to a localized area of the substrate. The space filled by liquid is smaller in plan than the top surface of the substrate and the area filled with liquid remains substantially stationary relative to the projection system PS while the substrate W moves underneath that area. Four different types of fluid handling structure are illustrated in FIGS. 2-5.

Figure 2:
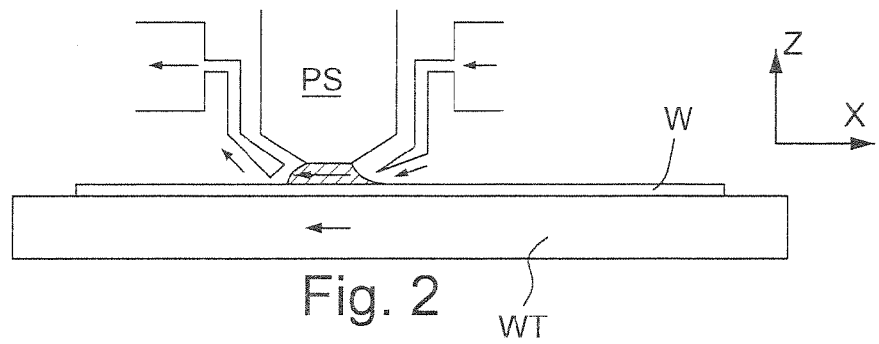
FIGS. 2 and 3 depict a fluid handling structure as a liquid supply: system for use in a lithographic projection apparatus.
Figure 3:
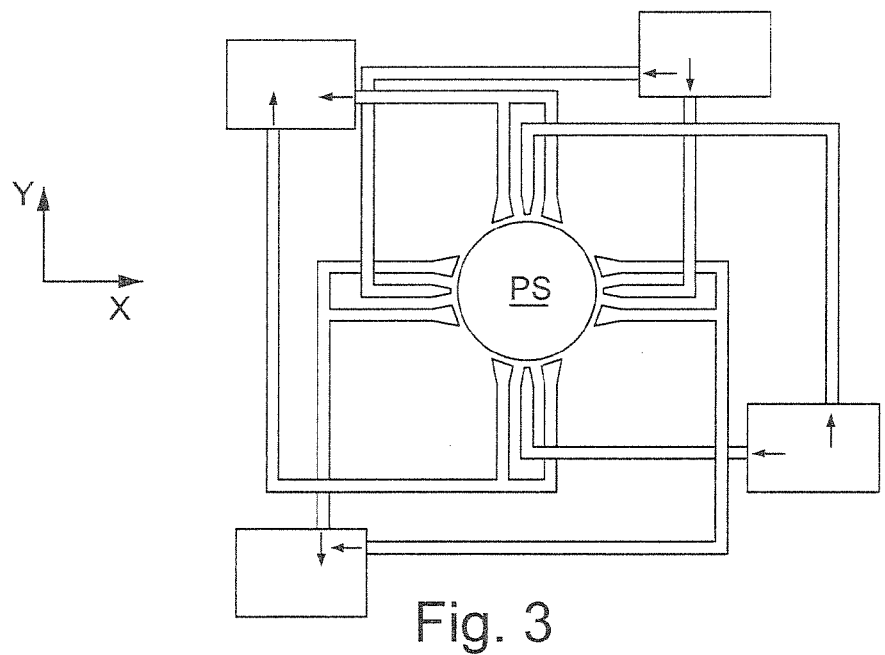

As illustrated in FIGS. 2 and 3, liquid is supplied by at least one inlet onto the substrate, preferably along the direction of movement of the substrate relative to the final element. Liquid is removed by at least one outlet after having passed under the projection system. That is, as the substrate is scanned beneath the element in a –X direction, liquid is supplied at the +X side of the element and taken up at the –X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Note that the direction of flow of fluid and of the substrate is shown by arrows in FIGS. 2 and 3.

Figure 4:
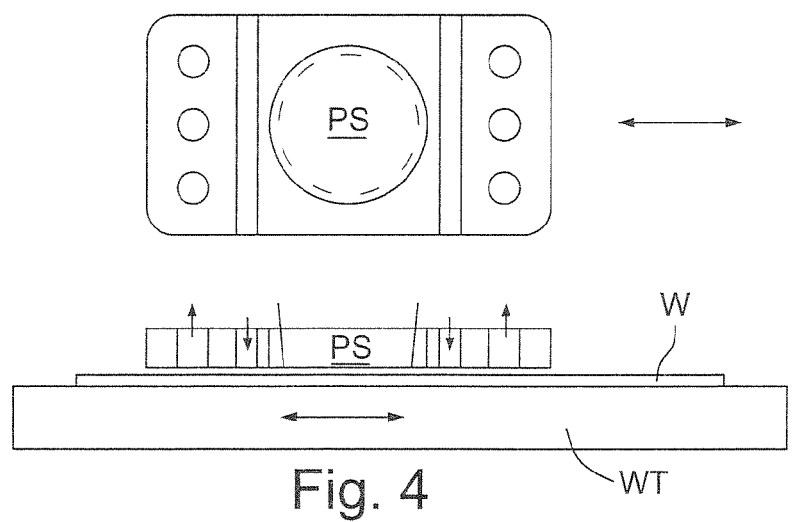
FIG. 4 depicts a further fluid handling structure as a liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets IN. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement member which extends along at least a part of a boundary of the space between the final element of the projection system and the substrate table. Such an arrangement is illustrated in FIG. 5.

Figure 5:
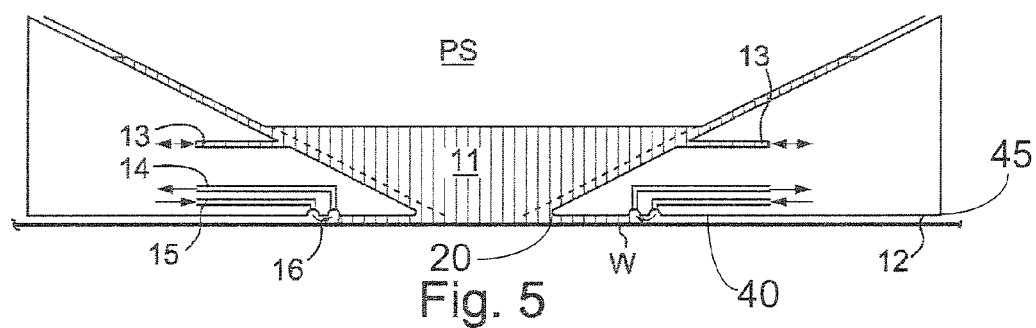
FIG. 5 depicts, in cross-section, a fluid handling structure.

FIG. 5 schematically depicts a localized liquid supply system with a fluid handling structure 12. The fluid handling structure 12 extends along at least a part of a boundary of the space 11 between the final element of the projection system PS and a facing surface which is desirably a substantially flat surface, e.g. the substrate table WT and/or the substrate W. (Please note that reference in the following text to surface of the substrate W also refers in addition or in the alternative to a surface of the substrate table WT, unless expressly stated otherwise.) The fluid handling structure 12 is substantially stationary relative to the projection system PS in the XY plane though there may be some relative movement in the Z direction (in the direction of the optical axis). In an embodiment, a seal is formed between the fluid handling structure 12 and the surface of the substrate W and may be a contactless seal such as fluid seal, desirably a gas seal. Such a system is disclosed in United States patent application publication no. US 2004-0207824, hereby incorporated in its entirety by reference.

The fluid handling structure 12 at least partly contains liquid in the immersion space 11 between a final element of the projection system PS and the substrate W. A contactless seal 16 to the substrate W may be formed in an undersurface 40 of the fluid handling structure 12 around the image field of the projection system PS so that liquid is confined within the space 11 between the substrate W surface and the final element of the projection system PS. Desirably the undersurface 40 is substantially parallel to the facing surface. The immersion space 11 is at least partly formed by the fluid handling structure 12 positioned below and surrounding the final element of the projection system PS. Liquid is brought into the space 11 below the projection system PS and within the fluid handling structure 12 by liquid inlet 13. The liquid may be removed by liquid outlet 13. The fluid handling structure 12 may extend a little above the final element of the projection system PS. The liquid level rises above the final element so that a buffer of liquid is provided. In an embodiment, the fluid handling structure 12 has an inner periphery that at the upper end closely conforms to the shape of the projection system PS or the final element thereof and may, e.g., he round. At the bottom, the inner periphery defined by an edge 20 of the undersurface 40 of the fluid handling structure 12 closely conforms to the shape of the image field, e.g., rectangular, though this need not be the case. The undersurface 40 has an outer edge 45 or rim.

The gas seal 16 is formed by gas, e.g. air or synthetic air but, in an embodiment, N7, or another inert gas. The gas in the gas seal 16 is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the fluid handling structure 12 and the substrate W contains the liquid in an immersion space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

Figure 6:
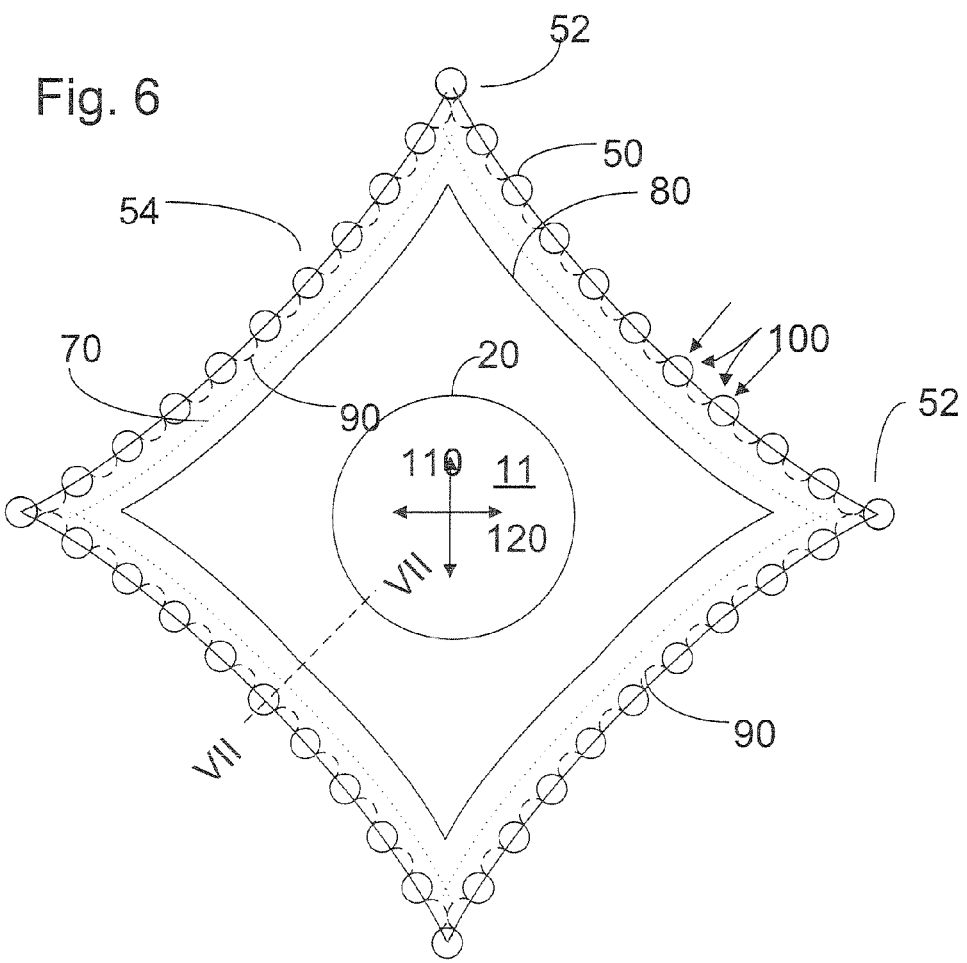
FIG. 6 depicts, in plan, a fluid handling structure according to an embodiment of the invention.

FIG. 6 illustrates a meniscus pinning device of an embodiment of the invention which may, for example, replace the seal arrangement 14, 15, 16 of FIG. 5. The meniscus pinning device of FIG. 6 comprises a plurality of discrete (extraction) openings 50. Each opening 50 is illustrated as being circular though this need not necessarily be the case. Indeed the shape of one or more of the openings 50 may be one or more selected from a square, a circle, a rectilinear shape, a rectangle, an oblong, a triangle, an elongate shape such as a slit, etc. Each opening 50 has, in plan, a large maximum cross-sectional dimension, such as a diameter, perhaps with a maximum dimension of greater than 0.5 mm, desirably greater than 1 mm. Thus, the openings 50 are unlikely to be affected much by contamination.

Each of the openings 50 of the meniscus pinning device of FIG. 6 may be connected to a separate under pressure source. Alternatively or additionally, each or a plurality of the openings 50 may be connected to a common chamber (which may be annular) which is itself held at an under pressure. In this way a uniform under pressure at each or a plurality of the openings 50 may be achieved. The openings 50 can be connected to a vacuum source and/or the atmosphere surrounding the liquid supply system may be increased in pressure to generate the required underpressure.

Each opening 50 is designed to extract a mixture of liquid and gas, for example in a two phase flow. The liquid is extracted from the space 11 whereas the gas is extracted from the atmosphere on the other side of the openings 50 to the liquid. This creates a gas flow as illustrated by arrows 100. This vas flow is effective to pin the meniscus 90 between the openings 50 substantially in place as illustrated in FIG. 6, for example between neighboring openings 50. The gas flow helps maintain the liquid confined by momentum blocking, by a gas flow induced pressure gradient and/or by drag (shear) of the gas flow on the liquid.

As can be seen from FIG. 6, the openings 50 are positioned so as to form, in plan, a polygonal shape having corners 52. In the case of FIG. 6 this is in the shape of a rhombus with the principal axes 110, 120 aligned with the major directions of travel of the substrate W under the projection system PS. This helps ensure that the maximum scan speed is faster than if the openings 50 were arranged in a circular shape. This is because the force on the meniscus between two openings 50 is reduced with a factor cos θ, where θ is the angle of the line connecting the two openings 50 relative to the direction in which the substrate W is moving. Thus, throughput can be optimized by having the primary axis 110 of the shape of the openings 50 aligned with the major direction of travel of the substrate (usually the scan direction) and to have a second axis 120 aligned with the other major direction of travel of the substrate (usually the step direction). It will be appreciated that any arrangement in which θ is different to 90° will give an advantage. Thus, exact alignment of the principal axes with the major directions of travel is not vital. It will further be appreciated that if the shape is circular, then there will always be two openings 50 which are aligned perpendicularly to the direction of travel so that the meniscus between those two outlets receives the maximum available force by movement of the substrate W. From the above, it can be seen that even the use of a square shape with the sides aligned at about 45° to the principal directions of travel of the substrate gives a great benefit. However, an embodiment of the invention is applicable to any shape made by the openings 50 in plan, for example a circle.

Radially outward of the openings may be a gas knife opening through which a gas flow may be supplied during operation. Such an arrangement is described in U.S. patent application No. 61/181,158 filed 25 May 2009, which is hereby incorporated by reference in its entirety.

Figure 7:
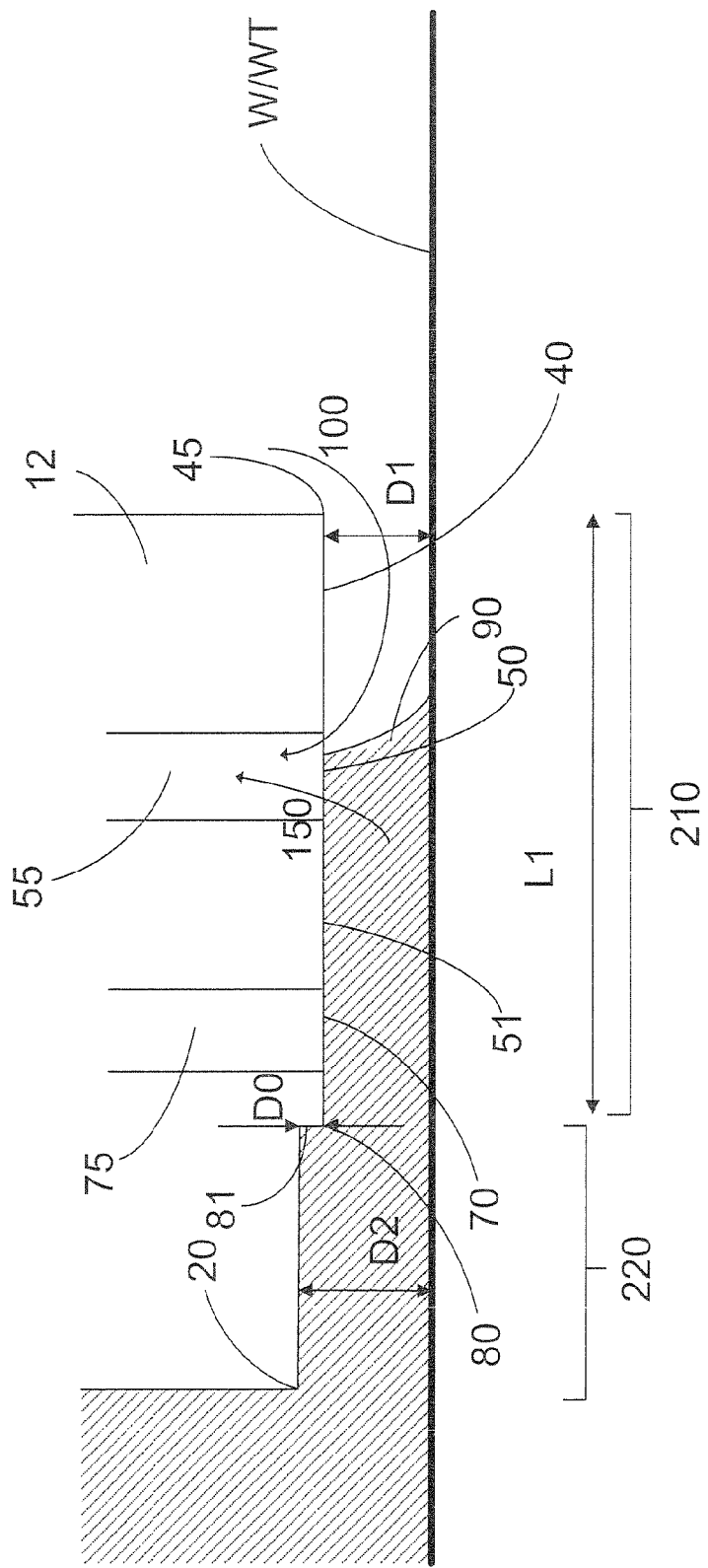
FIG. 7 depicts, in cross-section, a fluid handling structure according to an embodiment of the invention.

FIG. 7 is a cross-section through the fluid handling structure along the line VII-VII shown in FIG. 6. In FIG. 7 an arrow 100 shows the flow of gas from outside of the fluid handling structure 12 into the passageway 55 associated with the opening 50. The arrow 150 illustrates the passage of liquid from under the fluid handling structure 12, which may have come from the space 11, into the opening 50. The passageway 55 and opening 50 are designed so that two phase extraction (i.e. gas and liquid) desirably occurs in an annular flow mode, In annular flow mode gas substantially flows through the center of the passageway 55 and liquid substantially flows along the walls of the passageway 55. This results in smooth flow with low generation of pulsations, thereby helping to minimize the vibrations which may otherwise occur.

The meniscus 90 is pinned between the openings 50 with drag forces induced by gas flow into the opening 50. A gas drag velocity of greater than about 15 m/s, desirably 20 m/s is sufficient. In an embodiment there is no gas knife. By avoiding the use of a gas knife, the amount of evaporation of liquid from the substrate W may be reduced thereby reducing both splashing of liquid as well as thermal expansion/contraction effects.

A plurality of discrete passages 50 (e.g. around forty (40), such as thirty-six), which may be in the form of needles, each with a diameter of 1 mm and separated by 3.9 mm may be effective to pin a meniscus. The total gas flow in such a system is of the order of 100 l/min.

Further details of the openings 50 and the fluid handling structure 12 can be found in Unites States patent application publication no. US 2008/0212046 which is hereby incorporated by reference in its entirety.

Formed in the undersurface 40 is a further (supply) opening 70 which is for outletting fluid (e.g. liquid, such as immersion liquid) from the fluid handling structure 12. The further opening 70 may be considered as inletting liquid into the space 11 from a passageway 75 associated with the opening 70. The supply opening 70 is radially inwardly, with respect to the optical axis of the projection system PS, of the extraction opening 50, separated by a portion 51 of the undersurface 40. The liquid exiting the opening 70 of the fluid handling structure 12 is directed towards the substrate W. This type of opening 70 is provided in order to reduce the chances of bubbles being generated in the immersion liquid. Gas may become trapped in a gap between the edge of the substrate W and the substrate table WT. At an advancing part of the undersurface of the fluid handling structure 12, the facing surface of substrate W may be moving sufficiently fast relative to the fluid handling structure such that liquid is unable to flow from the space 11 to the opening 50. A portion of the undersurface of the fluid handing structure 12 between the edge 20 and the opening 50 may become dewetted, affecting the effectiveness of the meniscus pinning of the opening 50. Supplying liquid through the further opening 70, desirably near the opening 50, thereby helps reduce the risk of bubble inclusion and dewetting.

The geometry of the opening 70 has an impact upon the effectiveness of the fluid handling structure 12 in containing liquid.

In particular, it is desirable that the supply opening 70 has a shape, in plan which is cornered, like the shape of the opening 50, in plan, such as shown in FIG. 6. Indeed, the cornered shapes of the opening 70 and opening 50 are desirably substantially similar, such as shown in FIG. 6. In an embodiment, each shape has, at the apex of each corner an opening 70 or opening 50. Desirably each of a plurality of openings 70 are within 10 mm, desirably 5 mm, of each of a plurality of openings 50. That is, all parts of the shape made by the openings 50 are within 10 mm of a part of the shape made by the openings 70.

Further details regarding the extraction opening 50 and farther supply opening 70 may be found in United States patent application publication no. US 2009-0279060 which is hereby incorporated by reference in its entirety.

An underpressure is generated between the extraction opening 50 and the substrate W and/or substrate table WT. The closer the undersurface 40 is to the substrate W and/or substrate table WT, the stronger is the flow of gas 100 and thereby the better the pinning of the meniscus 90 in position. The greater the underpressure between the extraction opening 50 and the substrate W and/or substrate table WT, the greater the gas flow 100 and thereby the more stable the position of the meniscus 90. The underpressure between the opening 50 and the substrate W and/or substrate table WI results in an attractive force of the fluid handling structure 12 towards the substrate W and/or substrate table WT.

The now of liquid out of the supply opening 70 results in a repulsive force between the fluid handling structure 12 and the substrate W and/or substrate table WT.

For a normal separation between the fluid handling structure 12 and the substrate W and/or substrate table WI, the total force (the sum of the attractive force from extraction opening 50, the repulsive force from the supply opening 70 and gravity) is an attractive force. The stiffness of the fluid handling structure 12 (for example in the z direction, which may be the direction of the optical axis of the projection system PS and/or in a direction generally perpendicular to the surface of the substrate) represents how the force level changes with variations in distance between the fluid handling structure 12 and the substrate W and/or substrate table WT. Therefore in, an embodiment, stiffness is the derivative of total force on the y axis versus distance between the undersurface 40 of the fluid handling structure 12 and the substrate and/or substrate table WT along the x axis. In an embodiment the x and v axes may be in a plane parallel to the undersurface of the fluid handling structure. The x and y axes may be in a plane generally parallel to the surface of the substrate.

If the stiffness of the fluid handling structure 12 is too high at typical operating distances from the substrate W and/or substrate table WT this can result in a focusing error. This is because there is often a position error in the height of the fluid handling structure 12 above the substrate W and/or substrate table WT. Any variation from the desired height results in a difference in force with respect to the nominal (and calibrated) value. This difference in force leads to a displacement of the substrate W from the expected position and thereby a focusing error.

Figure 8:
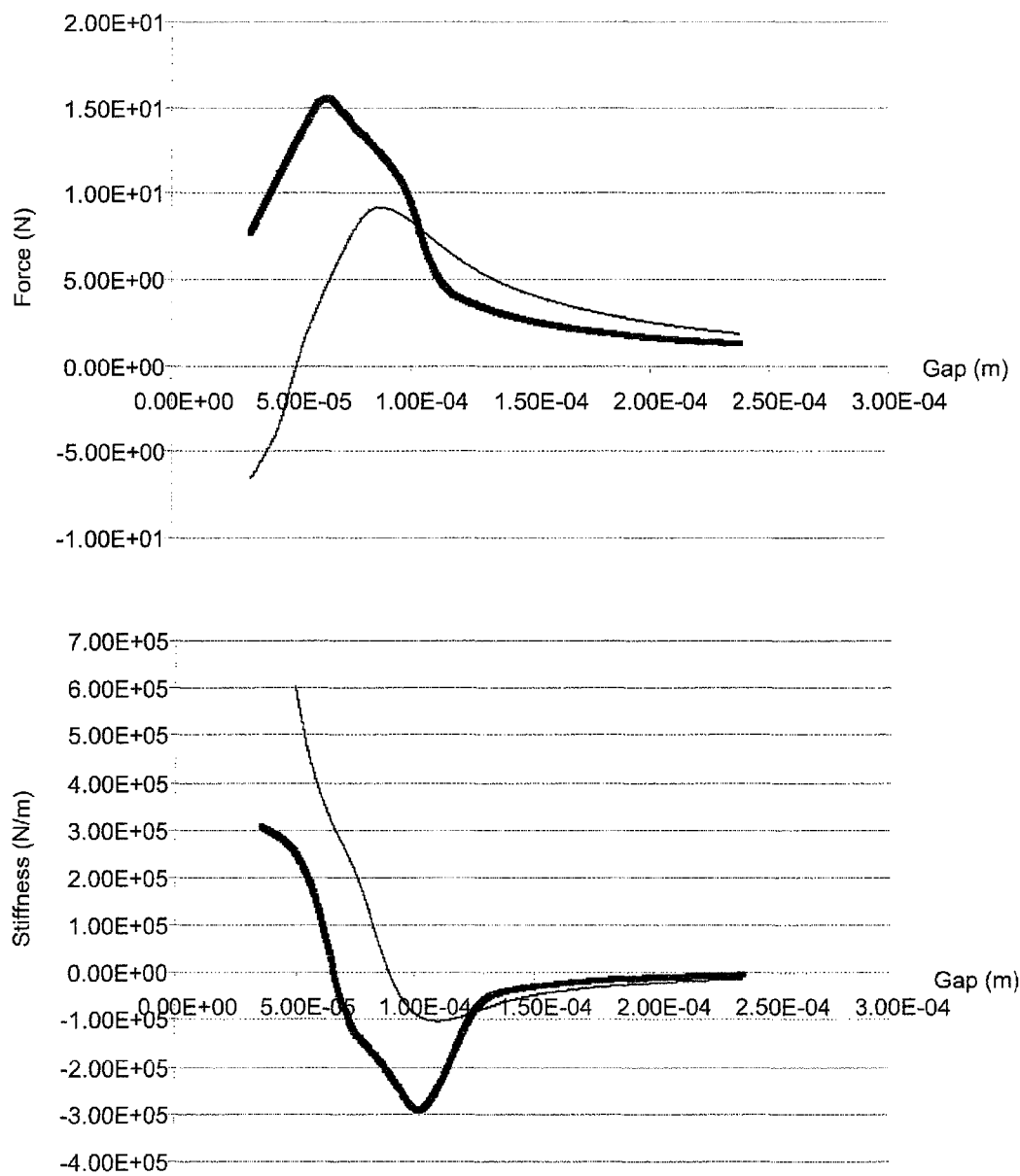
FIG. 8 depicts total force and stiffness versus distance for a fluid handling structure not according to the invention and a fluid handling structure according to an embodiment of the invention.

FIG. 8 (which will be explained in detail below) shows graphs for the total static force and the stiffness for two different fluid handling structures at different distances.

The bottom graph of FIG. 8 shows, for an embodiment, stiffness versus distance between the undersurface 40 and the substrate W and/or substrate table WT. It is to be noted that setting the distance between the undersurface 40 and substrate W and/or substrate table WT to be at the point where the stiffness is zero is not advisable because a small variation in the distance between the undersurface 40 and the substrate W and/or substrate table WT results in high stiffness being achieved relatively quickly. It can be seen that the stiffness can be set to be low if the distance between the undersurface 40 and the substrate and/or substrate table WT is high. However, if too large a gap exists between the fluid handling structure 12 and the substrate W and/or substrate table WT, there can be a loss of liquid because of increased instability of the meniscus 90 extending between the substrate W and/or substrate table WT and the undersurface 40. All of the above is for a given flow rate through the opening 50.

An embodiment of the invention relates to measures taken which can change the relationship between the stiffness between the undersurface 40 and substrate W and/or substrate table WT and the distance between the undersurface 40 and substrate W and/or substrate table WT. In particular the stiffness of the fluid handling structure 12 may be reduced in the region of the operating distance between the undersurface 40 and substrate W and/or substrate table WT.

As can be seen in FIG. 7, the extraction opening 50 and supply opening 70 are formed in a first portion 210 of the undersurface 40. In one embodiment, the first portion 210 has a planar, e.g. flat, surface with the openings 50, 70 formed therein. Desirably the first portion 210 is substantially parallel to the facing surface. In an embodiment the undersurface 40 between the supply opening 70 and extraction opening 50 is substantially featureless. In one embodiment, the surface between the supply opening 70 and the extraction opening 50 is planar, e.g. flat.

The plan area of the first portion 210 may have a large influence on the stiffness of the fluid handling structure 12. As shown in FIG. 7, the plan area of the first portion 210 can be decreased by forming a second portion 220 on the undersurface 40 of the fluid handling structure 12 which in use is a different distance from the substrate W and/or substrate table WT. The second portion 220 is in a different plane to the first portion 210. This means that in order to achieve the difference in distance from the facing surface between the first and second portions 210, 220 the undersurface 40 of the fluid handling structure 12 is not planar and may not be flat. In an embodiment, at least a portion of the undersurface 40 of the fluid handling structure 12 is at an angle to the top surface of the substrate W and/or substrate table WT.

In an embodiment the second portion 220 is radially inward of the first portion 210. The second portion 220 may extend between the inner edge 20 of the undersurface 40 and the first portion 210. In an embodiment the first portion 210 is in one plane and the second portion 220 may be in another plane. The planes of the first and second portions 210, 220 may be parallel to each other. In an embodiment the two planes may be angled with respect to each other.

In FIG. 7 the distance of the first portion 210 from the second portion 220 along a z axis is illustrated as dimension D0. The distance of the first portion from the substrate W and/or substrate table WT is illustrated as dimension D1 and the distance of the second portion 220 from the substrate and/or substrate table WT is illustrated as dimension D2. As can be seen, the dimension D2 is greater than dimension D1. The difference between D1 and D2 is D0. Desirably the dimension D2 is at least two times, more desirably at least three or four times the dimension D1. So the dimension D0 is at least the same as D1, desirably twice as large or more desirably three times as large as D1. Typically in use, dimension D1 is in the range of 100-300 microns, desirably 130-230 microns.

In the embodiment of FIG. 7, a step change in height 80 is present between the first portion 210 and the second portion 220. The step change forms a step edge 81 in the undersurface 40, as shown in FIGS. 6 and 7. The step may be described as a discontinuous change in the undersurface. In an embodiment the surface of the step between the first and second portions 210, 220 may be angled with respect to one or both of the first and second portions. The surface of the step edge 81 may be planar. In an embodiment, surface of the step edge 81 between the first and second portions 210, 220 may be perpendicular to one or both of the surfaces of the first and second portions 210, 220. There may be two discontinuous angle changes in the undersurface 40 with respect to the z axis between the first and second portions 210, 220: for example, between the first portion 210 and the surface of the step edge 81, and between the surface of the step edge 81 and the second portion 220. However, this is not necessarily the case and FIGS. 9 and 10 show different variations.

Figure 9:
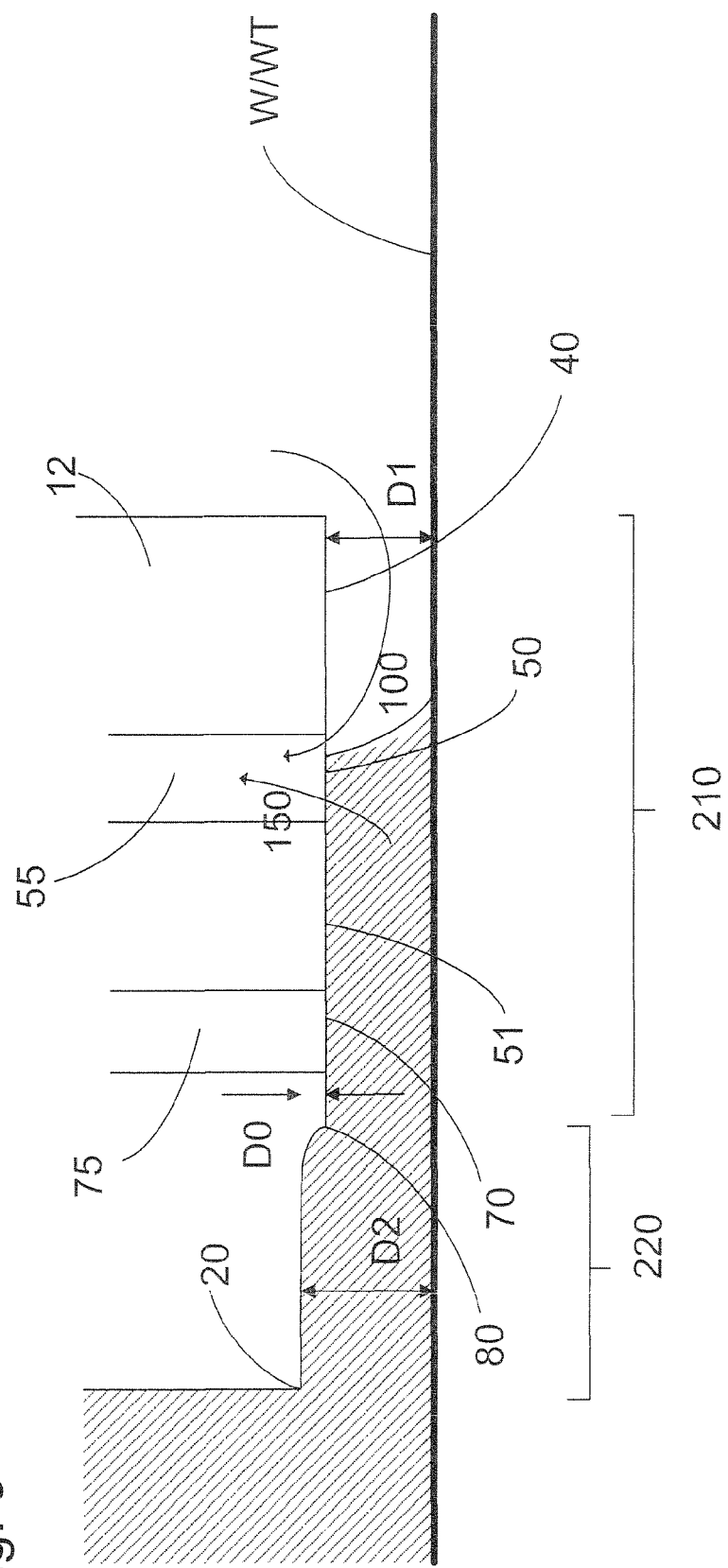
FIG. 9 depicts, in cross-section, a fluid handling structure in accordance with a further embodiment of the invention.

FIG. 9 is an embodiment in which there is a step change in the angle of the undersurface 40 with respect to the z axis between the first portion 210 and second portion 220 as well as a portion at which the change in angle is continuous. In FIG. 10 the change in angle of the undersurface 40 with respect to the z axis between the first portion 210 and the second portion 220 is continuous. The change in height and angle may be smooth so that there is no step change in height or step change in angle.

Figure 10:
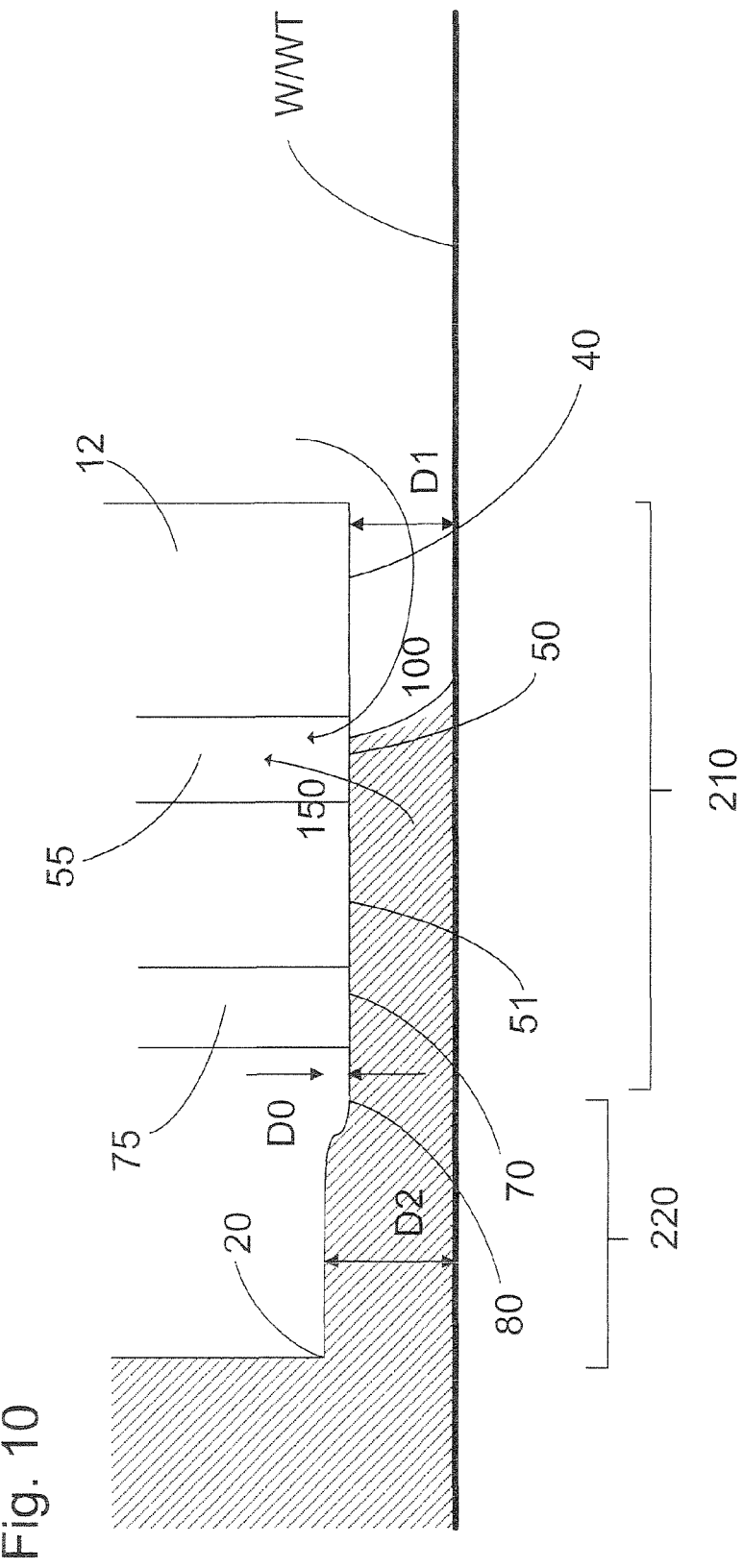
FIG. 10 depicts, in cross-section, a fluid handling structure in accordance with a further embodiment of the invention.

Combinations of the embodiments of FIGS. 7, 9 and 10 are also possible. In each embodiment, the first portion 210 may be described as protruding with respect to the second portion 220. The second portion 220 may be recessed with respect to the first portion 210.

In an embodiment the size of the undersurface 40 could be reduced. However, it may be difficult to fit all the required ducts and/or chambers in the fluid handling structure 12. Therefore, in an embodiment, the first and second portions 210, 220 are in use at different distances from the facing surface provided by the substrate W and/or substrate table WT. In using this arrangement, the stiffness of the fluid handling structure 12 can be decreased for a given flow rate through the opening 50 and at a given distance between the undersurface and the facing surface. Alternatively, an embodiment of the invention can allow a larger flow rate through the opening 50 and/or smaller distance between the undersurface and the facing structure for a given stiffness.

By reducing the size of the first portion 210 (the arrangement in United States patent application no. US 2009-0279060 has a first portion which comprises all of the undersurface 40 of the fluid handling structure 12) both the attractive force which results from the underpressure applied to extraction opening 50 and the repulsive force which results from liquid being supplied out of supply opening 70 are decreased. This may he achieved without a negative effect on the functions performed by the openings 50, 70 (pinning of the meniscus 90 and filling of the gap between the substrate W and/or substrate table WT). That is because the flow rates out of the openings 50, 70 can be maintained, and the distance between the first portion 210 and the substrate W and/or substrate table WT can be maintained.

The height of the step (i.e. D0 or D2 minus D1) is desirably 100-1000 µm, more desirably between 300 and 500 µm. Desirably the step (i.e., D0 or D2 minus D0 is at least 10 µm, desirably more than 20 or more than 50 µm.

In an embodiment the radial length of the first portion 210 (illustrated as L1 in FIG. 7) is at most 10 mm long in the radial direction, desirably less than 6 mm long. (Note that the radial length is the length across the surface in a plane perpendicular to the z direction. It may be the distance between a point on an outer edge 45 and a point on the step 80, in a direction perpendicular to the edge of the step 80 in the undersurface 40). In an embodiment the length L1 is between 4 and 6 mm. In one embodiment the second portion 220 is not present. This compares to the same dimension in United States patent application publication no. US 2009-0279060 of L1 which typically varies between 25 mm and 6 mm dependent upon in which radial direction the length is being measured.

FIG. 8 illustrates the variation in total force and variation in stiffness for two fluid handling structures 12. The thick line is data from a fluid handling structure 12 according to an embodiment of the invention. For comparison, the thin line is shown the same results for a fluid handling structure 12 such as that illustrated in United States patent application publication no. US 2009-0279060 where the whole of the undersurface 40 of the fluid handling structure 12 comprises the first portion 210 as defined herein. As can be seen in the bottom graph of FIG. 8, reducing the size of the first portion 210 in which the supply opening 70 and extraction opening 50 are formed considerably reduces the stiffness of the fluid handling structure 12, particularly for a typical operating distance D1 (desirably 130-200 µm). Similarly, as can be seen in the top graph of FIG. 8, reducing the size of the first portion 210 in which the supply opening 70 and extraction opening 50 are formed considerably reduces the force on the facing surface (e.g., substrate W) due to the fluid handling structure 12, particularly for a typical operating distance D1 (desirably 130-200 µm). The size of the first portion 210 (by which is meant its radial length and/or surface area in plan) can be varied to suit the particular stiffness required at the desired distance D1.

An embodiment of the present invention may be desirable because having a first portion of limited dimension, e.g. a reduced dimension of the first portion, may reduce the undesirable effect of dynamic forces on the facing surface W, WT. In use of a fluid handling structure 12 with a smaller first portion 210 in a radial direction less disturbance forces may be applied to the facing surface W, WT than a first portion 210 with a larger radial direction. With a smaller first portion 210 in a radial direction, the smaller first portion 210 has smaller surface area to interact with the facing surface W, WT. The disturbance forces are thereby reduced.

As shown in FIG. 6, an opening 50 located in a corner 52 is further from the inner edge 20 than an opening 50 located between two adjacent corners 52. The longer that the shortest distance is between an opening and the inner edge 20, the larger the pressure drop at the corner 52. A larger pressure drop may risk less liquid reaching the opening 50. The undersurface 40 in the region of the opening 50 may de-wet. The instability of the meniscus at the region of the corner 52 may be higher than between corners 52, risking liquid loss for example due to meniscus detachment.

By reducing the shortest distance between the inner edge 20 to the opening 50 around the inner periphery of the undersurface 40, so that the shortest distance is substantially the same for an opening 50 at a corner 52 and between corners 52, the increased pressure drop at a corner may be reduced, for example, so that it is substantially uniform for each opening 50. The meniscus stability at a corner 52 may therefore relatively improve. The shortest distance from the inner edge 20 to the opening 50 may be achieved by having the first portion 210 closer to the facing surface W, WT than other parts of the undersurface 40, so that the shortest distance is between each opening 50 and the closest part of the step 80. By having a more stable meniscus, defectivity may be improved.

In an embodiment there is provided a fluid handling structure. The fluid handling structure is configured to supply and confine immersion liquid to a space defined between a projection system and a facing surface facing the fluid handling structure. A first portion of an undersurface of the fluid handling structure, in use, is a different distance from the facing surface than a second portion of the undersurface. The first portion has formed in it: a supply opening and an extraction opening. The supply opening is configured to supply liquid toward the facing surface. The extraction opening is configured to remove fluid from between the fluid handling structure and the facing surface.

In use, the second portion may be further from the facing surface than the first portion. The second portion may be in a different plane to the first portion. The second portion may be radially inwardly of the supply opening with respect to an optical axis of the projection system.

The supply opening may be radially inwardly of the extraction opening with respect to the optical axis of the projection system.

The first portion of the undersurface may be in one plane. The first portion may be substantially featureless between the extraction and supply openings. The first portion may be at most 10 mm in length in the radial direction with respect to the optical axis of the projection system, desirably at most 6 mm in length in the radial direction. The length of the first portion in the radial direction may be selected from the range of 2 to 10 mm with respect to the optical axis of the projection system, desirably from the range of 4 to 6 mm.

Between the first and second portions there may be a step change in angle of the plane of undersurface with respect to the optical axis of the projection system and/or distance of the undersurface from the facing surface. Between the first portion to the second portion there may be a portion of continuous angular change in angle of the plane of the undersurface with respect to the optical axis of the projection system and/or distance of the undersurface from the facing surface.

The difference in distance between the distance of the first portion from the facing surface and the second portion from the facing surface may be at least 10 μm, desirably 20 μm, or more desirably at least 50 μm. The difference in distance between the distance of the first portion from the facing surface and the second portion from the facing surface may be selected from the range of 100-1000 μm, desirably from the range of 300-500 μm. The difference in distance between the distance of the first portion from the facing surface and the second portion from the facing surface may be at least a factor of 2, desirably at least a factor of 3.

The facing surface may be a substantially flat surface and may be substantially parallel to the first portion of the undersurface.

In an embodiment there is provided a fluid handling structure. The fluid handling structure is configured to supply and confine immersion liquid to a space defined between a projection system and a facing surface facing the fluid handling structure. An undersurface of the fluid handling structure has formed therein a supply opening and an extraction opening. The supply opening is configured to supply liquid toward the facing surface. The extraction opening is configured to remove fluid from between the fluid handling structure and the facing surface. The undersurface is at most 10 mm in length in the radial direction with respect to the optical axis of the projection system.

In an embodiment there is provided a fluid handling structure. The fluid handling structure is configured to supply and confine immersion liquid to a space defined between a projection system and a facing surface facing the fluid handling structure. In a portion of an undersurface of the fluid handling structure is formed a supply opening and an extraction opening. The supply opening is configured to supply liquid toward the facing surface. The extraction opening is configured to remove fluid from between the fluid handling structure and the facing surface. The portion of the undersurface is protruding with respect to another portion of the undersurface.

In an embodiment there is provided an immersion lithographic apparatus comprising a projection system and a fluid handling structure. The projection system is configured to project a beam of radiation onto a substrate supported by a substrate table. The fluid handling structure is as described herein. The facing surface is the surface of the substrate and/or the surface of the substrate table.

In an embodiment there is provided a device manufacturing method. The device manufacturing method comprises: providing a fluid. The providing of a fluid provides a fluid between a final element of a projection system and a substrate. The providing includes supplying liquid and removing fluid. In supplying liquid, liquid is supplied towards the substrate through a supply opening in an undersurface of a fluid handling structure. In removing fluid, fluid is removed from between the fluid handling structure and the substrate and/or a substrate table through an extraction opening in the undersurface of the fluid handling structure. The openings are formed in a first portion of the undersurface of the fluid handling structure which is a different distance from the substrate and/or substrate table than a second portion of the undersurface.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media. Controllers described above may have any suitable configuration for receiving, processing, and sending signals. For example, each controller may include one or more processors for executing the computer programs that include machine-readable instructions for the methods described above. The controllers may include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath. only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

Moreover, although this invention has been disclosed in the context of certain embodiments and examples, it will be understood by those skilled in the art that the invention extends beyond the specifically disclosed embodiments to other alternative embodiments and/or uses of the invention and obvious modifications and equivalents thereof. In addition, while a number of variations of the invention have been shown and described in detail. other modifications. which are within the scope of this invention, will be readily apparent to those of skill in the art based upon this disclosure. For example, it is contemplated that various combination or subcombinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the invention herein disclosed should not be limited by the particular disclosed embodiments described above, but should be determined only by a fair reading of the claims that follow.

The descriptions above are intended to be illustrative, not limiting. Thus, it will be apparent to one skilled in the art that modifications may be made to the invention as described without departing from the scope of the claims set out below.

What is claimed is:

1. A fluid handling structure configured to supply and confine immersion liquid to a space defined between a projection system and a facing surface facing the fluid handling structure, wherein a first portion of an undersurface of the fluid handling structure, in use, is at a different distance from the facing surface than a second portion of the undersurface, and the first portion has formed in it:

a supply opening configured to supply liquid toward the facing surface; and an extraction opening configured to remove fluid from between the fluid handling structure and the facing surface, and wherein, in use, the second portion is further from the facing surface than the first portion and is radially inwardly of the supply opening with respect to an optical axis of the projection system.

2. The fluid handling structure of claim 1, wherein the second portion is in a different plane to the first portion.

3. The fluid handling structure of claim 1, wherein the supply opening is radially inwardly of the extraction opening with respect to the optical axis of the projection system.

4. The fluid handling structure of claim 1, wherein the first portion of the undersurface is in one plane.

5. The fluid handling structure of claim 1, wherein the first portion is substantially featureless between the extraction and supply openings.

6. The fluid handling structure of claim 1, wherein between the first and second portions there is a step change in angle of the plane of undersurface with respect to the optical axis of the projection system and/or distance of the undersurface from the facing surface.

7. The fluid handling structure of claim 1, wherein between the first portion to the second portion there is a portion of continuous angular change in angle of the plane of the undersurface with respect to the optical axis of the projection system and/or distance of the undersurface from the facing surface.

8. The fluid handling structure of claim 1, wherein the difference in distance between the distance of the first portion from the facing surface and the second portion from the facing surface is at least 10 µm.

9. The fluid handling structure of claim 1, wherein the difference in distance between the distance of the first portion from the facing surface and the second portion from the facing surface is selected from the range of 100-1000 µm.

10. The fluid handling structure of claim 1, wherein the difference in distance between the distance of the first portion from the facing surface and the second portion from the facing surface is at least a factor of 2.

11. The fluid handling structure of claim 1, wherein the first portion is at most 10 mm in length in the radial direction with respect to the optical axis of the projection system.

12. The fluid handling structure of claim 1, wherein the length of the first portion in the radial direction with respect to the optical axis of the projection system is selected from the range of 2 to 10 mm.

13. The fluid handling structure of claim 1, wherein the facing surface is a substantially flat surface and is substantially parallel to the first portion of the undersurface.

14. A fluid handling structure configured to supply and confine immersion liquid to a space defined between a projection system and a facing surface facing the fluid handling structure, wherein an undersurface of the fluid handling structure has formed therein a supply opening configured to supply liquid toward the facing surface and an extraction opening configured to remove fluid from between the fluid handling structure and the facing surface, wherein the undersurface is at most 10 mm in length in a radial direction with respect to the optical axis of the projection system.

15. A fluid handling structure configured to supply and confine immersion liquid to a space defined between a projection system and a facing surface facing the fluid handling structure, wherein in a portion of an undersurface of the fluid handling structure is formed:
- a supply opening configured to supply liquid toward the facing surface; and
- an extraction opening configured to remove fluid from between the fluid handling structure and the facing surface, the extraction opening extending around the space in a non-circular shape,
- wherein the portion of the undersurface is protruding with respect to another portion of the undersurface around the space at an edge and wherein the shortest distance between the edge and the extraction opening is substantially the same around the space.

16. An immersion lithographic apparatus comprising:
- a projection system configured to project a beam of radiation onto a substrate supported by a substrate table; and
- a fluid handling structure configured to supply and confine immersion liquid to a space defined between a projection system and a facing surface facing the fluid handling structure, the facing surface being the surface of the substrate and/or the surface of the substrate table, wherein an undersurface of the fluid handling structure has formed therein a supply opening configured to supply liquid toward the facing surface and an extraction opening configured to remove fluid from between the fluid handling structure and the facing surface, wherein the undersurface is at most 10 mm in length in a radial direction with respect to the optical axis of the projection system.

17. An immersion lithographic apparatus comprising:
- a projection system configured to project a beam of radiation onto a substrate supported by a substrate table; and
- a fluid handling structure configured to supply and confine immersion liquid to a space defined between a projection system and a facing surface facing the fluid handling structure, the facing surface being a surface of the substrate and/or the surface of the substrate table, wherein in a portion of an undersurface of the fluid handling structure is formed:
    - a supply opening configured to supply liquid toward the facing surface; and
    - an extraction opening configured to remove fluid from between the fluid handling structure and the facing surface,
    - wherein the portion of the undersurface is protruding with respect to another portion of the undersurface and the another portion is radially inwardly of the supply opening with respect to an optical axis of the projection system.

18. The apparatus of claim 17, wherein the portion of the undersurface is in one plane.

19. The apparatus of claim 17, wherein the portion is at most 10 mm in length in the radial direction with respect to the optical axis of the projection system.

20. A device manufacturing method comprising:
- providing a fluid between a final element of a projection system and a substrate by supplying liquid towards the substrate through a supply opening in an undersurface of a fluid handling structure; and
- removing fluid from between the fluid handling structure and the substrate and/or a substrate table through an extraction opening in the undersurface of the fluid handling structure,
- wherein the openings are formed in a first portion of the undersurface of the fluid handling structure which is at a different distance from the substrate and/or substrate table than a second portion of the undersurface, and
- wherein the second portion is further from the facing surface than the first portion and is radially inwardly of the supply opening with respect to an optical axis of the projection system.

* * * * *